United States Patent [19]

Takayama et al.

[11] Patent Number: 5,343,201
[45] Date of Patent: Aug. 30, 1994

[54] A-D CONVERTER

[75] Inventors: Tsutomu Takayama, Kawasaki; Kan Takaiwa, Hachioji, both of Japan

[73] Assignee: Canon Kabushiki Kaisha, Tokyo, Japan

[21] Appl. No.: 331,171

[22] Filed: Mar. 31, 1989

[30] Foreign Application Priority Data

| Apr. 7, 1988 | [JP] | Japan | 63-86813 |
| Apr. 7, 1988 | [JP] | Japan | 63-86814 |
| Apr. 19, 1988 | [JP] | Japan | 63-97431 |

[51] Int. Cl.⁵ .................. H03M 1/36; H03M 1/18; H04N 9/64
[52] U.S. Cl. .................. 341/200; 341/159; 341/139; 341/138; 348/655
[58] Field of Search .......... 341/139, 159, 141, 155, 341/200; 358/32, 27, 21 R, 25, 174, 170, 166, 160, 29

[56] References Cited

U.S. PATENT DOCUMENTS

| 3,688,221 | 8/1972 | Fruhalf | 341/138 X |
| 3,879,724 | 4/1975 | McDonald | 341/131 |
| 4,016,557 | 4/1977 | Zitelli et al. | 341/159 X |
| 4,086,579 | 4/1978 | Easter | 341/159 |
| 4,179,687 | 12/1979 | van de Plassche et al. | 340/347 |
| 4,216,465 | 8/1980 | Huelsman et al. | 340/347 |
| 4,217,574 | 8/1980 | Anderson | 341/159 X |
| 4,649,371 | 3/1987 | Kolluri | 341/159 |
| 4,774,579 | 9/1988 | Kuchernan et al. | 358/160 |
| 4,831,378 | 5/1989 | Baars et al. | 341/139 |
| 4,831,382 | 5/1989 | Debus, Jr. et al. | 341/200 |
| 4,866,261 | 9/1989 | Pace | 341/138 |
| 4,875,049 | 10/1989 | Yoshida | 341/139 X |
| 4,945,405 | 7/1990 | Hirota | 358/29 X |
| 4,963,978 | 10/1990 | Ueda et al. | 358/29 |
| 5,128,751 | 7/1992 | Ohara | 358/29 |

Primary Examiner—Sharon D. Logan
Attorney, Agent, or Firm—Fitzpatrick, Cella, Harper & Scinto

[57] ABSTRACT

An A-D converter of an image signal comprises a weighing circuit for performing a different weighing for each quantization step of A/D conversion. The different weighing is performed in accordance with gamma or white compression characteristics of the image signal.

14 Claims, 10 Drawing Sheets

FIG. 8

A-D CONVERTER

BACKGROUND OF THE INVENTION

1. Field of the Invention

This invention relates to an A/D (analog to digital) converter of an image signal in an imaging device or the like.

2. Description of the Prior Art

Examples of known A-D converters are shown in U.S. Pat. Nos. 4,179,687 and 4,216,465. The converters shown in those patents incorporate variously quantized steps of signal conversion (see FIG. 7 and col. 8, lines 20–38 of U.S. Pat. No. 4,179,687 and FIGS. 2, 3, 5 and 8 and col. 4, lines 3–55, col. 5, line 67 to col. 6 line 2, col. 6 lines 37–63 and col. 8, line 50 to col. 9, line 10 of U.S. Pat. No. 4,216,465).

There have been many well-known A/D converters of image signals. In accordance with a recent tendency of providing a wider band for signals, there have been practically utilized A/D converters in which A/D (analog to digital) conversion speed is improved up to several tens of MHz (megahertz) and quantization is performed in 8 bit increments.

However, in A/D conversion of image signals in an imaging device, the conventional quantization bit number is insufficient due to the following reasons.

(1) The dynamic range of image signals is several times larger than that of usual television signals.

(2) When gamma correction is performed after A/D conversion, quantization noises at low-brightness portions are increased at least less than three times.

(3) When white balance is performed after A/D conversion, an incease in dynamic range of at least twice is further required.

(4) When AGC (automatic gain control) is performed after A/D conversion, an increase in dynamic range of several times is further required.

Since the quantization bit number is insufficient as described above, there has hitherto been a need for performing analog signal processing, such as white compression, gamma correction, white balance and the like, before A/D conversion. This causes an increase of circuit scale, and the effect of digital signal processing is offset.

An increase of quantization bit number naturally causes a tremendous increase of circuit scale and insufficiency in A/D conversion speed, and so is very difficult in the present A/D conversion and LSI (large scale integrated circuits) techniques.

SUMMARY OF THE INVENTION

It is an object of the present invention to provide an A-D converter in which the above-described problems of the prior art are solved.

It is another object of the present invention to provide an imaging device having a small circuit scale.

In order to achieve these objects, an A-D converter of an image signal of an embodiment of the present invention comprises weighing means for performing a different weighing for each quantization step of A/D conversion.

According to the above-described embodiment, an even quantization accuracy can be obtained over the range of entire signal levels, by providing means for performing a different weighting for each quantization step of A/D conversion.

An A-D converter of another embodiment of the present invention comprises control means for variably controlling a full-scale range of A/D conversion of an image signal.

According to the above-described embodiment, by providing means for providing a control circuit for variably controlling a full scale range of A/D conversion, an always even quantization accuracy can be obtained relative to variations in the gain of the image signal and the like.

An A-D converter of still another embodiment of the present invention comprises means for performing A/D conversion of an output signal of an imaging device by a one-channel A-D converter, and switching a full scale range of the A-D converter in accordance with a signal which is being subjected to A/D conversion.

According to the above-described embodiment, by providing means for performing A/D conversion of an output signal of an imaging device by a one-channel A-D converter, and switching a full scale range of the A-D converter in accordance with a signal which is being subjected to A/D conversion, it becomes possible to obtain an always even quantization accuracy for each of R, G and B (red, green and blue) image signals, and a digital signal having an excellent white balance over the entire control range of white balance, without remarkably increasing circuit scale.

These and other objects and features of the present invention will become more apparent from the following description and drawings.

DETAILED DESCRIPTION OF THE PREFERRED EMBODIMENTS

Figure 1:
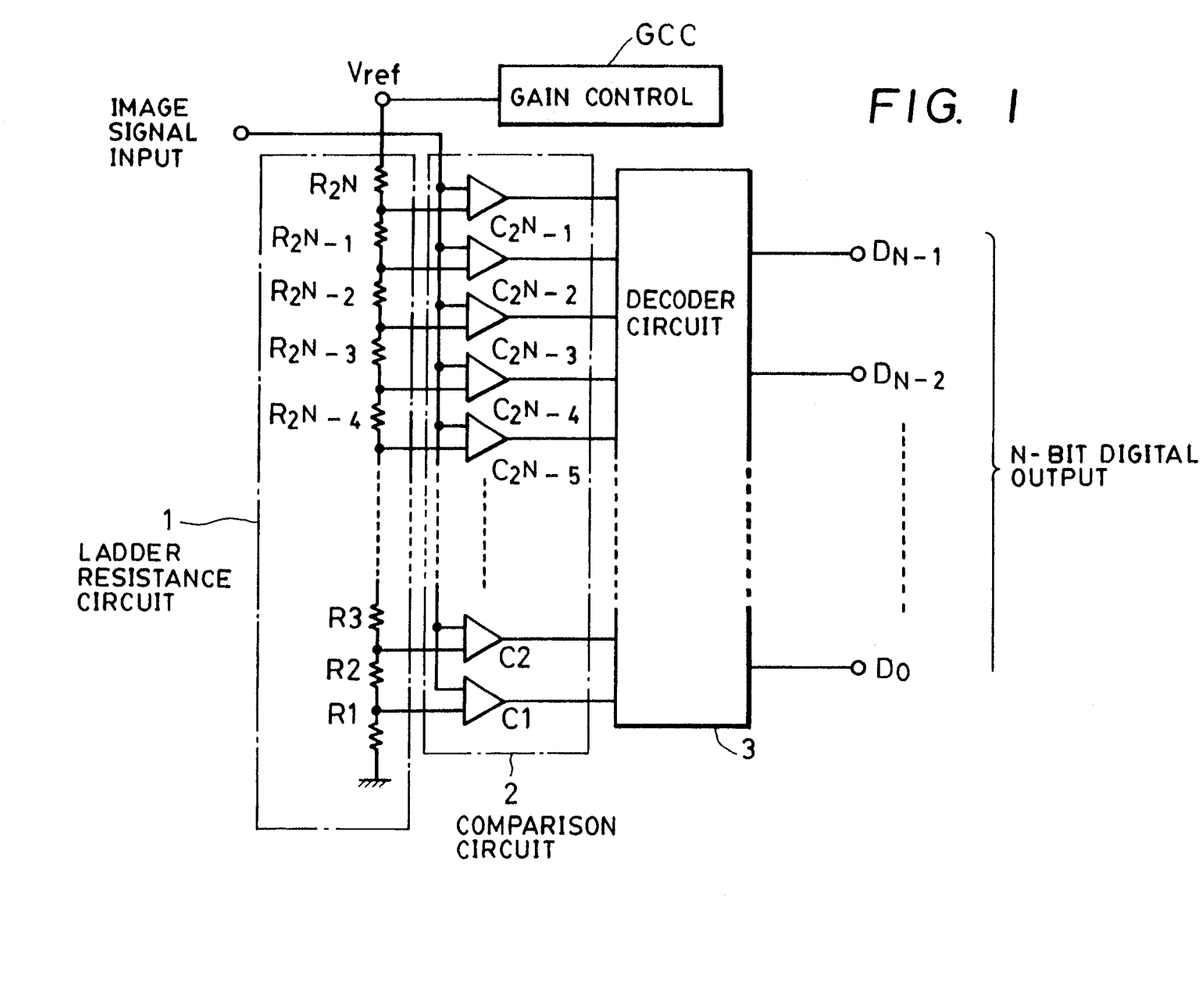
FIG. 1 is a circuit and block diagram of an A-D converter of a first embodiment of the present invention.

FIG. 1 shows an N-bit A-D converter which utilizes a full parallel comparison method of A/D conversion. In FIG. 1, a ladder resistance circuit 1 comprises $2^N$ resistances corresponding to the $(2^N-1)$ quantization steps of A-D conversion and connected in series between a reference voltage source $V_{ref}$ and ground. The potential $V_{ref}$ across the ladder resistance circuit is variably controlled by a control signal of a gain control circuit GCC. A comparison circuit 2 comprises ($2^N-1$) comparators $C_1$-$C_2-1$. A decoder circuit 3 converts an output of the comparison circuit 2 into an N-bit natural binary code.

Figure 2:
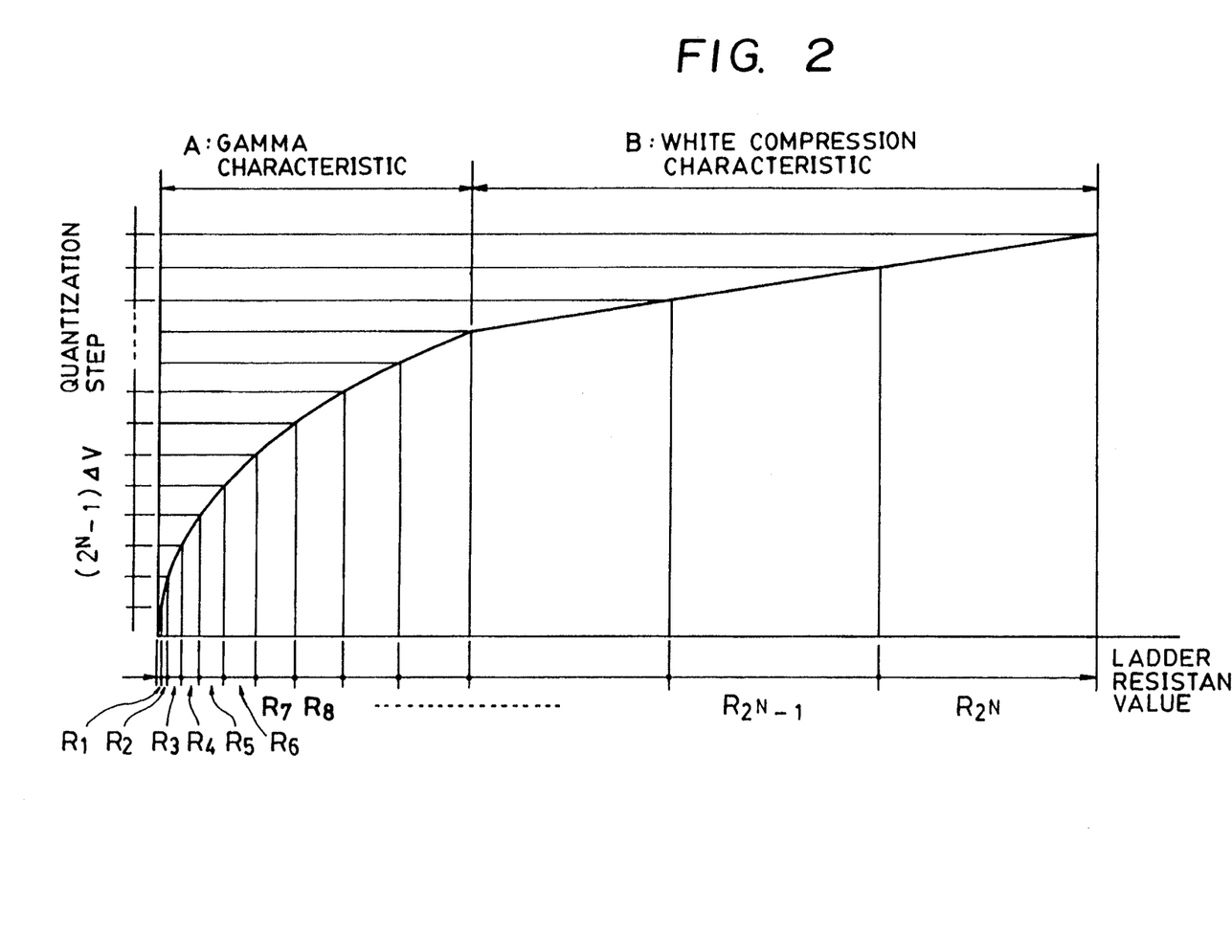
FIG. 2 is a diagram showing a relationship between the values of ladder resistances in the A-D converter of FIG. 1 and quantization steps performed in the A-D converter.

FIG. 2 shows a relationship between the ratios (relative values) of the values of the $2^N$ resistances of the ladder resistance circuit 1 in FIG. 1 and corresponding quantization steps of an input signal. The abscissa represents the values of ladder resistances, and the ordinate represents the quantization steps. FIG. 2 also shows a nonlinear characteristic of an image signal. In FIG. 2, the portion A corresponds to the gamma characteristic of an image signal, and the portion B corresponds to the white compression characteristic of the image signal.

In the present embodiment, as is apparent from FIG. 2, the values of ladder resistances $R_1$, $R_2$, $R_3$---, $R_{2^N-1}$, $R_{2^N}$ are determined so that an equal quantization step a $\Delta V$ can be obtained after non-linear processing, such as the gamma characteristic, the white compression characteristic and the like. These resistance values may naturally be, for example, three of four kinds of resistance values, within a range that a desired non-linear characteristic can be obtained.

Digital outputs $D_0$, $D_1$, ---, $D_{N-1}$ from the decoder circuit 3 thus obtained have been subjected to non-linear processing, and so additional gamma correction and white compression circuits are not thereafter needed.

As explained above, in the present embodiment, it is possible to obtain a nearly even quantization accuracy over the range of entire signal levels of image signals, by making the resistance values of the ladder resistance circuit for A/D conversion correspond to a non-linear characteristic.

Figure 3:
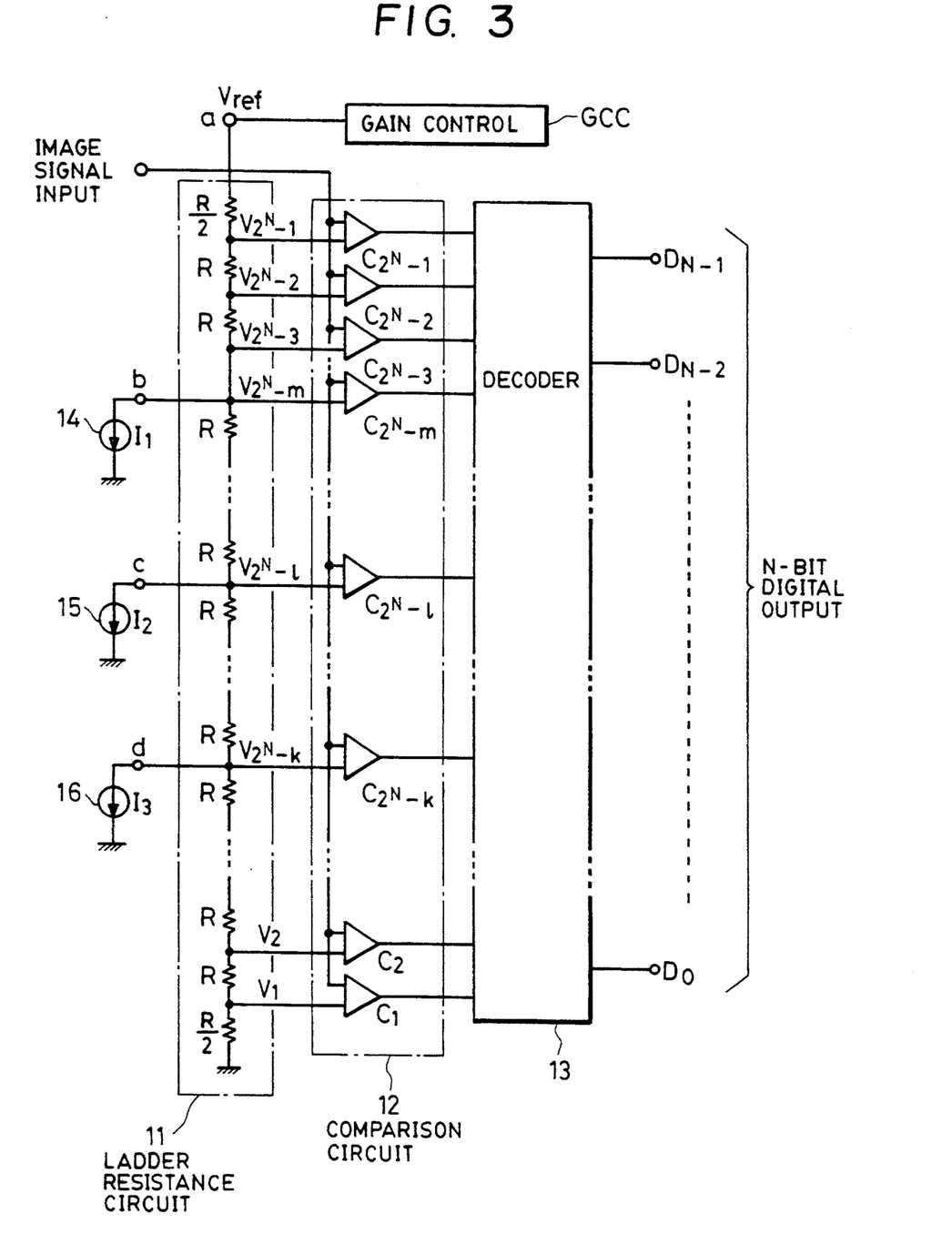
FIG. 3 is a circuit and block diagram of an A-D converter of a second embodiment of the present invention.
Figure 4:
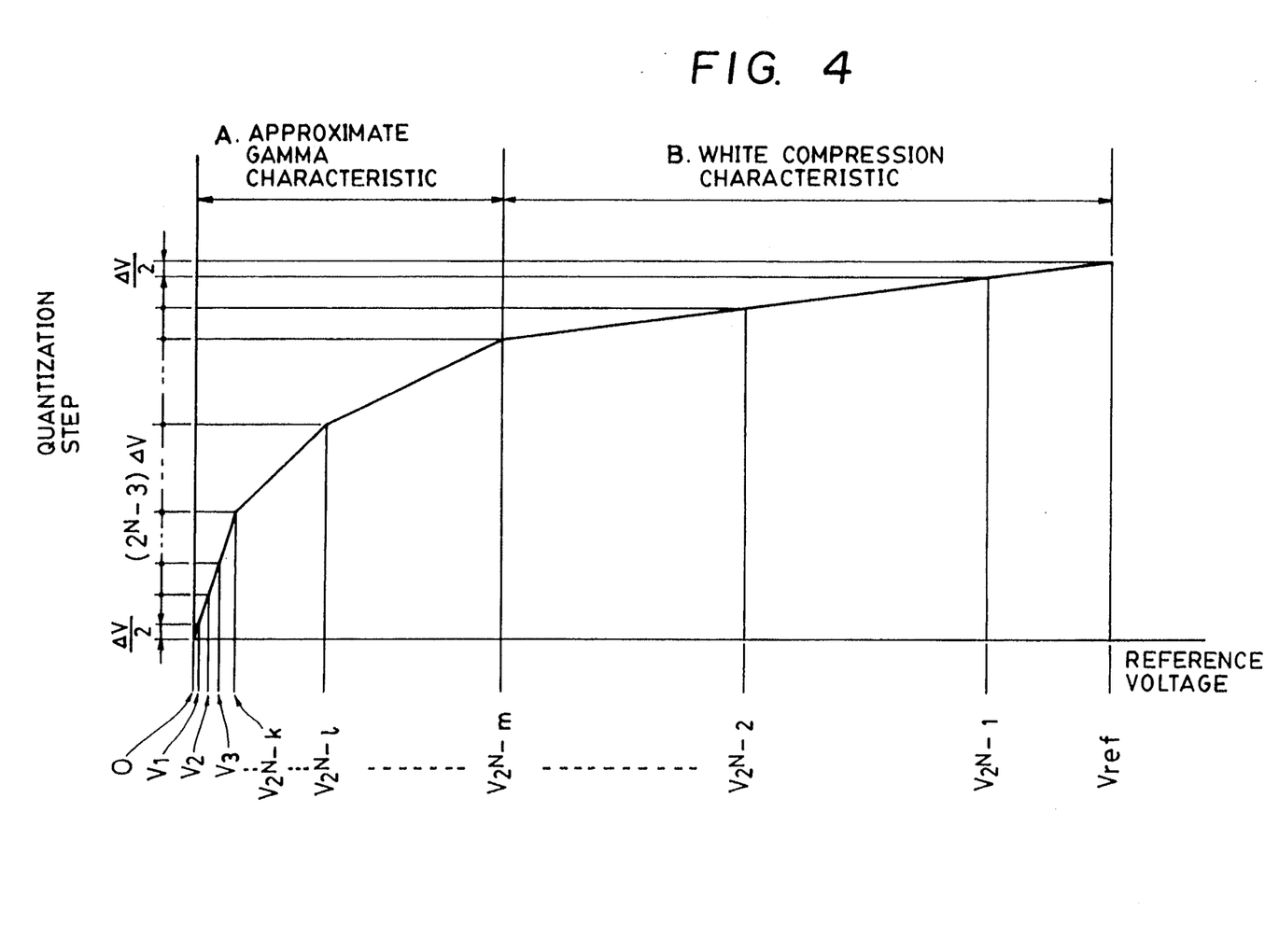
FIG. 4 is a diagram showing a relationship between reference voltages in the converter of FIG. 3 and quantization steps performed in the converter.

FIG. 3 shows a second embodiment of the present invention. In FIG. 3, a ladder resistance circuit 11 comprises $2^N$ resistances. Resistance values consist of two kinds as in a general full parallel comparison method A-D converter. There are ($2^N-2$) resistances R connected in series and two resistances R/2 connected to both ends, as shown in FIG. 3. A potential $V_{ref}$ is applied across the ladder resistance circuit and is controlled by a gain control circuit GCC. A comparison circuit 12 comprises ($2^N-1$) comparators $C_1$-$C_{2^N-1}$. A decoder circuit 13 converts an output of the comparison circuit 12 into an N-bit natural binary code. There are also shown constant current sources 14, 15 and 16 connected between ground and selected points along the ladder resistance circuit 11, FIG. 4 shows a relationship between reference voltages, which constitute a weighting means, $V_1$, $V_2$, $V_3$,..., $V_{2N-1}$, $V_{2N-m}$, 1 1 1, $V_{2^N-1}$ generated at the ladder resistance circuit 11 and the reference voltage source $V_{ref}$ in FIG. 3 and corresponding quantization steps. FIG. 4 also shows a non-linear characteristic of an input image signal. The portion A represents the gamma characteristic by three-segment approximation, and the portion B represents the white compression characteristic.

In the present embodiment, as is apparent from FIG. 4, the values of reference voltages $V_1$, $V_2$, $V_3$--- $V_{2^N-k}$ ---$V_{2^N-1}$ --- $V_{2^N-m}$, --- $V_{2-2}$, $V_{2^N-1}$ are determined so that an equal quantization step $\Delta V$ ($\Delta V/2$ at both black and white ends of the signal) can be obtained, after non-linear processing, such as gamma characteristic, white compression characteristic and the like. These reference voltage values are capable of being arbitrarily set according to current values of the constant current sources 21 4, 15 and I 6, For example, if the current value $I_1$ of the constant current source 14 is determined so that the current value between terminals b - c becomes ¼ of the current value between terminals a - b in FIG. 3, a white compression characteristic which is compressed by ¼ can be obtained. Similarly, the respective current values $I_2$ and $I_3$ of the current sources 15 and 16 may be determined so that the current values between terminal s c - d, and terminals d - GND have a desired gamma characteristic by three-segment approximation.

As explained above, in the present embodiment, by providing constant current sources at predetermined terminals of a ladder resistance circuit for A/D conversion, and setting current values of constant current sources so that a desired non-linear characteristic can be obtained, it is possible to obtain a nearly even quantization accuracy over the range of entire signal levels of image signals. In the present embodiment, it is also possible to arbitrarily change the non-linear characteristic by providing external constant current sources.

The above-described constant current sources may also be replaced by resistances without any problem.

Although for the present embodiment, an explanation is provided in regard to an A/D converter which carries out a full parallel comparison method, this embodiment is not limited thereto provided that a ladder resistance circuit is utilized.

As explained above, by performing a different weighting for each quantization step of an A/D converter in accordance with an input signal level, it is possible to obtain an even quantization accuracy over the range of entire signal levels of image signals, and it never occurs that quantization noises increase at low signal levels.

Furthermore, in the present invention, it is possible to simultaneously obtain a desired non-linear characteristic, such as gamma characteristic, white compression characteristic and the like. Hence, a drastic reduction of circuit complexity is possible.

The present invention can also be easily applied to a color imaging device, by performing white balance adjustment of color signals, for example, R, G and B signals, and then supplying the resultant signals to the A-D converter of the present invention.

Figure 5:
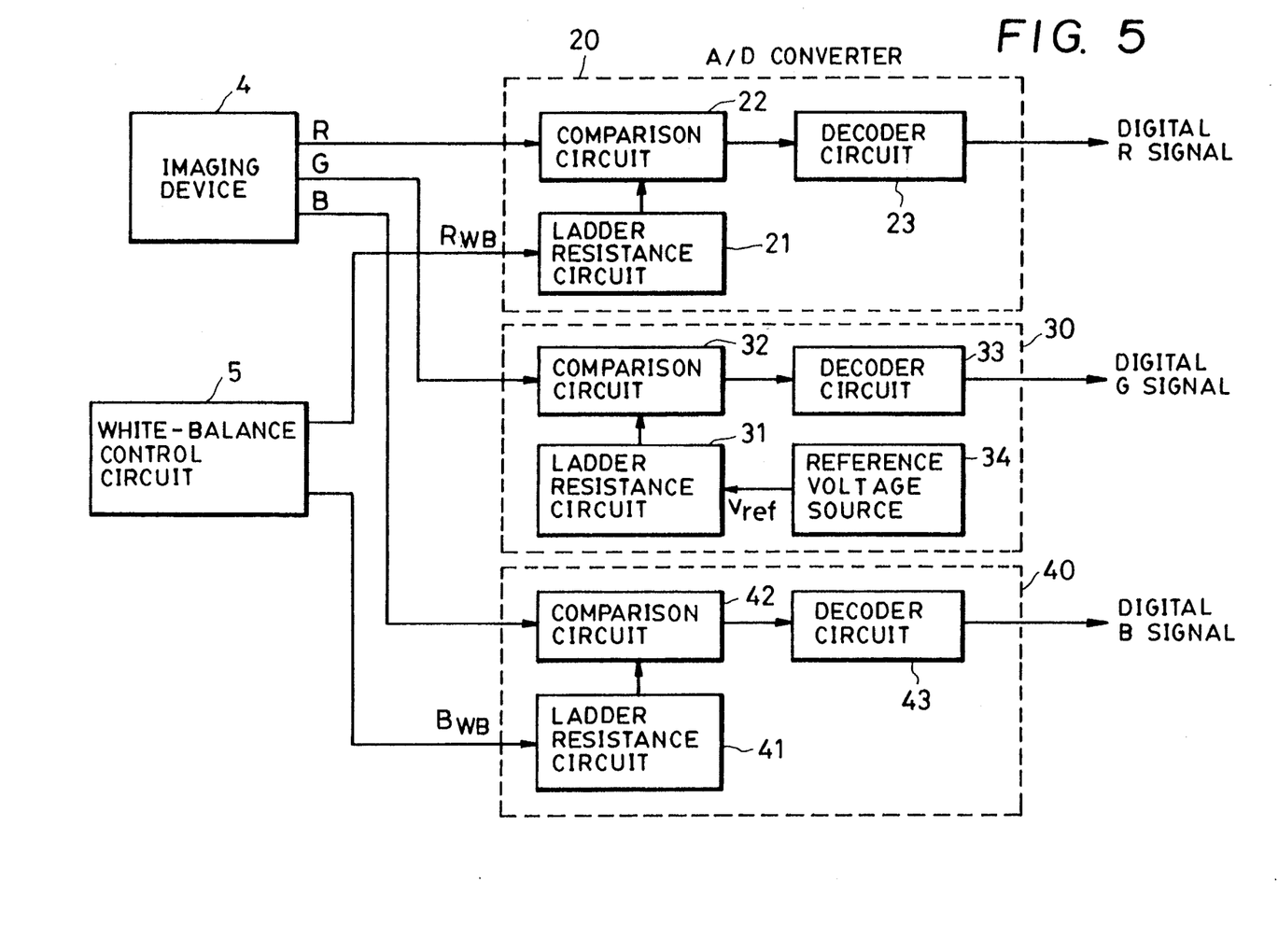
FIG. 5 is a block diagram of a third embodiment of the present invention.

FIG. 5 shows a third embodiment of the present invention. In FIG. 5, analog R, G and B signals are generated at an imaging device 4. There are also shown A-D converters 20, 30 and 40, ladder resistance circuits 21, 31 and 41, comparison circuits 22, 32 and 42 which receive, respectively, the R, G and B signals, and decoder circuits 23, 33 and 43 for converting outputs of the comparison circuits into natural binary codes. A reference voltage from a reference voltage source 34 is supplied to the ladder resistance circuit 31 of the G-signal A-D converter 30. A white balance control circuit 5 generates red and blue white balance control voltages $R_{WB}$ and $B_{WB}$ adapted to the color temperature of a light source for an object which the imaging device 4 is imaging. The white balance control circuit 5 which includes, for example, an R sensor, a B sensor and a G sensor, performs logarithmic compression of the output of each sensor, and subsequently develops the above-described $R_{WB}$ and $B_{WB}$ voltages by obtaining mutual differences.

In the present embodiment, these white balance control voltages are supplied to the ladder resistance circuits 21 and 41 of the R-signal A-D converter 20 and the B-signal A-D converter 40, respectively, and are controlled so that the ratios to the reference voltage $V_{ref}$ supplied to the ladder resistance circuit 31 of the G-signal A-D converter 30 become gain differences of the R and B signals relative to a digitized G signal.

Figure 6:
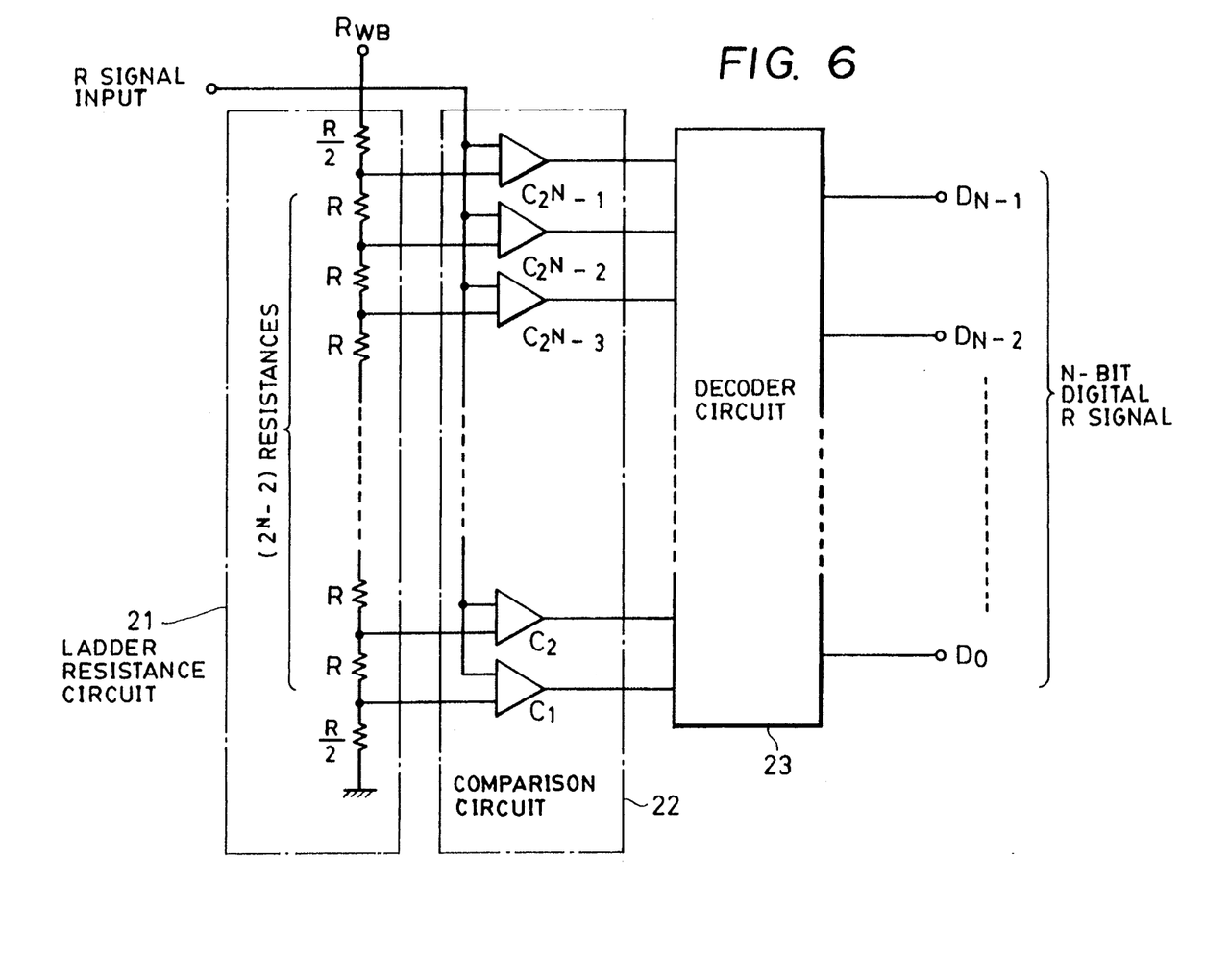
FIG. 6 is a detailed circuit and block diagram of the A-D converter of FIG. 5.

This process will be explained in detail using FIG. 6. FIG. 6 is a circuit and block diagram of the interior of the R-signal A-D converter 20 of FIG. 5. As shown in FIG. 6, the ladder resistance circuit 21 comprises $(2^N-2)$ resistances R connected in series and two resistances R/2 across the ends. The comparison circuit 22 comprises $(2^N-1)$ comparators. The decoder circuit 23 converts an output of the comparison circuit 22 into a natural binary code, and generates an N-bit digital R signal.

Figure 7:
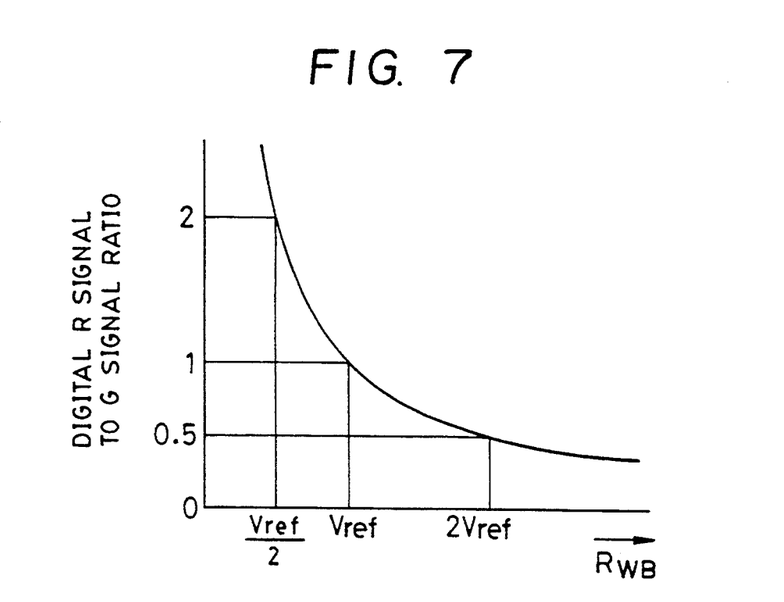
FIG. 7 is a diagram for explaining operation of a white-balance control circuit in the A-D converter of FIG. 5.

The control voltage $R_{WB}$ from the white balance control circuit 5 in FIG. 5 is supplied to the ladder resistance circuit 21 as a reference voltage. In this case, the control voltage $R_{WB}$ determines the full scale range of the A-D converter 20. Hence, as shown in FIG. 7, the gain ratio of the output of a digitized R signal to the output of a digital G signal becomes equal to the reciprocal of the ratio of full scale ranges, that is, $V_{ref}/P_{WB}$.

Consequently, it becomes possible that the $R_{WB}$ controls the gain of the R signal so that a proper white balance is obtained relative to the color temperature of the light source in the white balance control circuit 5 of FIG. 5.

The white balance control vol rage $B_{WB}$ also controls the gain of the B signal so that a proper white balance is obtained.

As explained above, in the present embodiment an always even quantization accuracy can be obtained over the entire control range of white balance, and it is also possible to obtain digital signals in which white balance control has been completed, without increasing circuit complexity.

Figure 8:
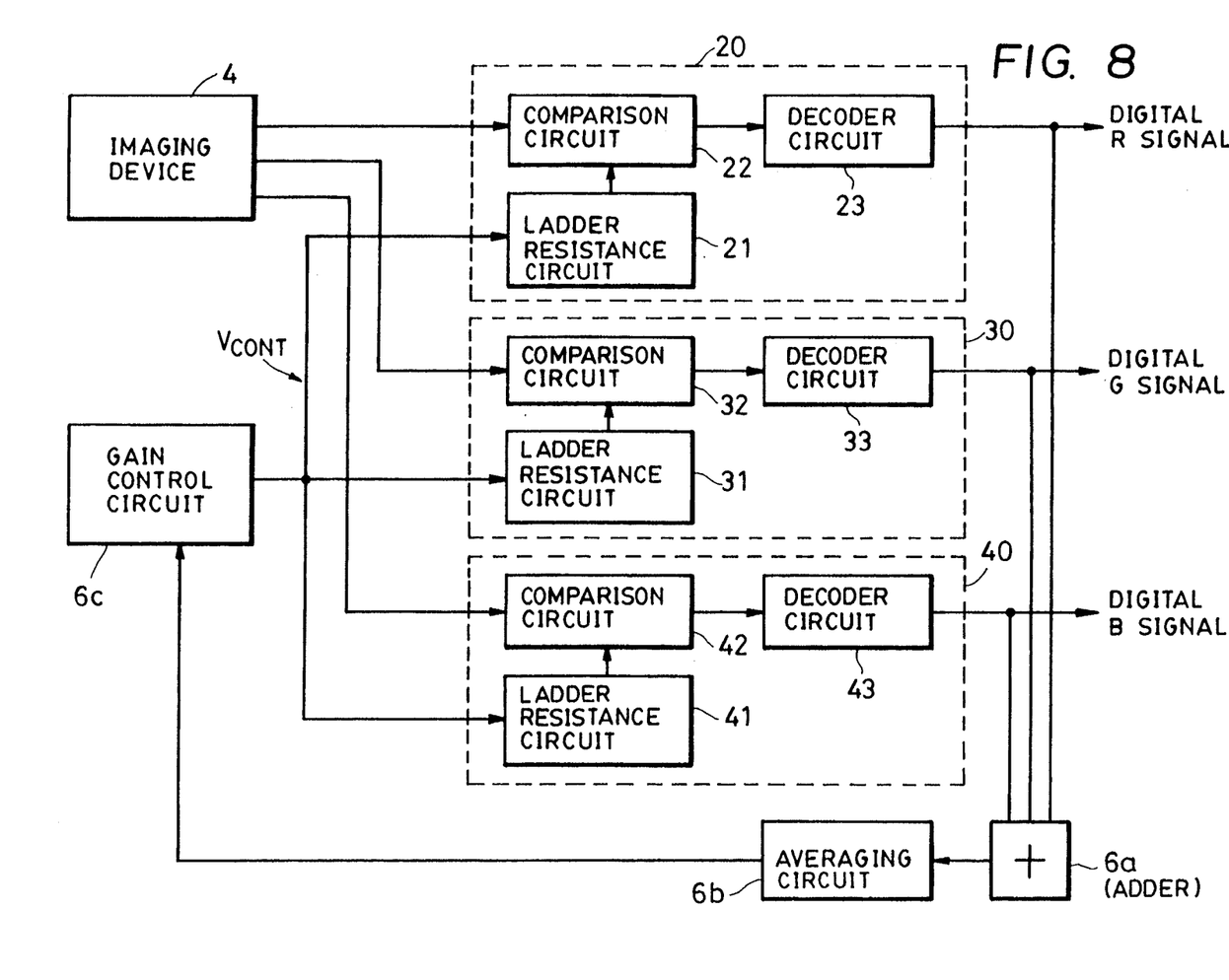
FIG. 8 is a block diagram of a fourth embodiment of the present invention.
Figure 9:
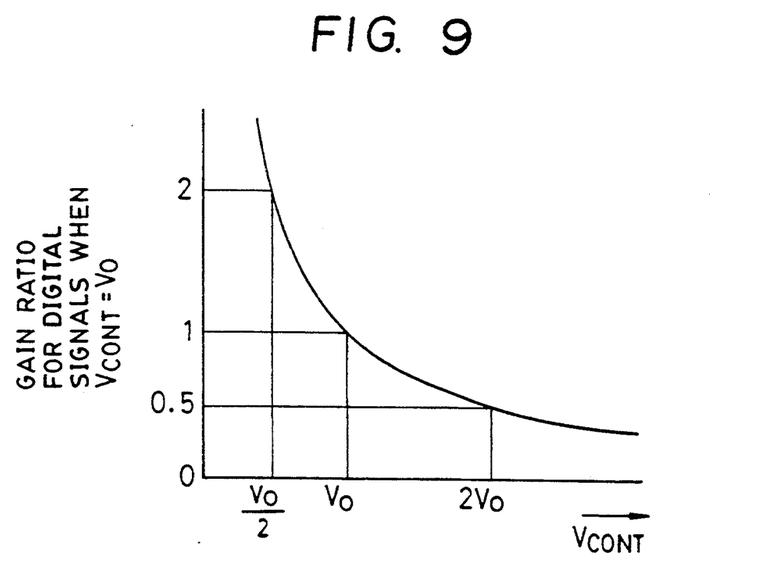
FIG. 9 is a diagram for explaining a gain control circuit in the embodiment of FIG. 8.

FIG. 8 shows a fourth embodiment of the present invention. In FIG. 8, circuit blocks corresponding to those in the third embodiment are indicated by like numerals. An adder 6a adds digital R. G and B signals an averaging circuit 6b aver-ages tile added signal for a predetermined period. A gain control circuit 6c then forms a feedback signal so that the output of the averaging circuit is brought to a predetermined level, and supplies a gain control voltage $V_{CONT}$ as a reference voltage of the ladder resistance circuits 21, 31 and 41. The voltage $V_{CONT}$ determines full scale ranges of the A-D converters 2, 3 and 4. The gain of the digitized R, G and B signals relative to the voltage $V_{CONT}$ is as shown in FIG. 9, where $V_0$ is a predetermined gain control voltage set as a standard making the gain control 0 dB. As is apparent from FIG. 9, the gain ratio for digital signals when $V_{CONT}=V_0$ becomes equal to $V_{CONT}/V_0$.

Accordingly, it is possible to control the voltage $V_{CONT}$ SO that the gain of each of the digitized R, G and B signals is automatically brought to a predetermined level. In the gain control circuit 6c, it is also possible to make adjustments manually or according to information from an external photosensor so that a digital signal is at a constant signal level.

As explained above, in the present embodiment an always even quantization accuracy over the entire gain control range of the R, G and B signals carl be obtained and it never occurs that quantization errors increase at high gains. It is also possible to obtain digital signals in which gain control has been completed, without increasing the complexity of the circuit.

As explained above, by providing a control circuit which variably controls the full scale range of an A-D converter in accordance with gain to be given to an image signal and the like, an even quantization accuracy over the entire gain range of the image signal can be obtained and it never occurs that quantization noise increases at high gains.

In the present invention, a remarkable reduction of circuit is also possible because white balance and automatic gain control can be simultaneously performed.

Figure 10:
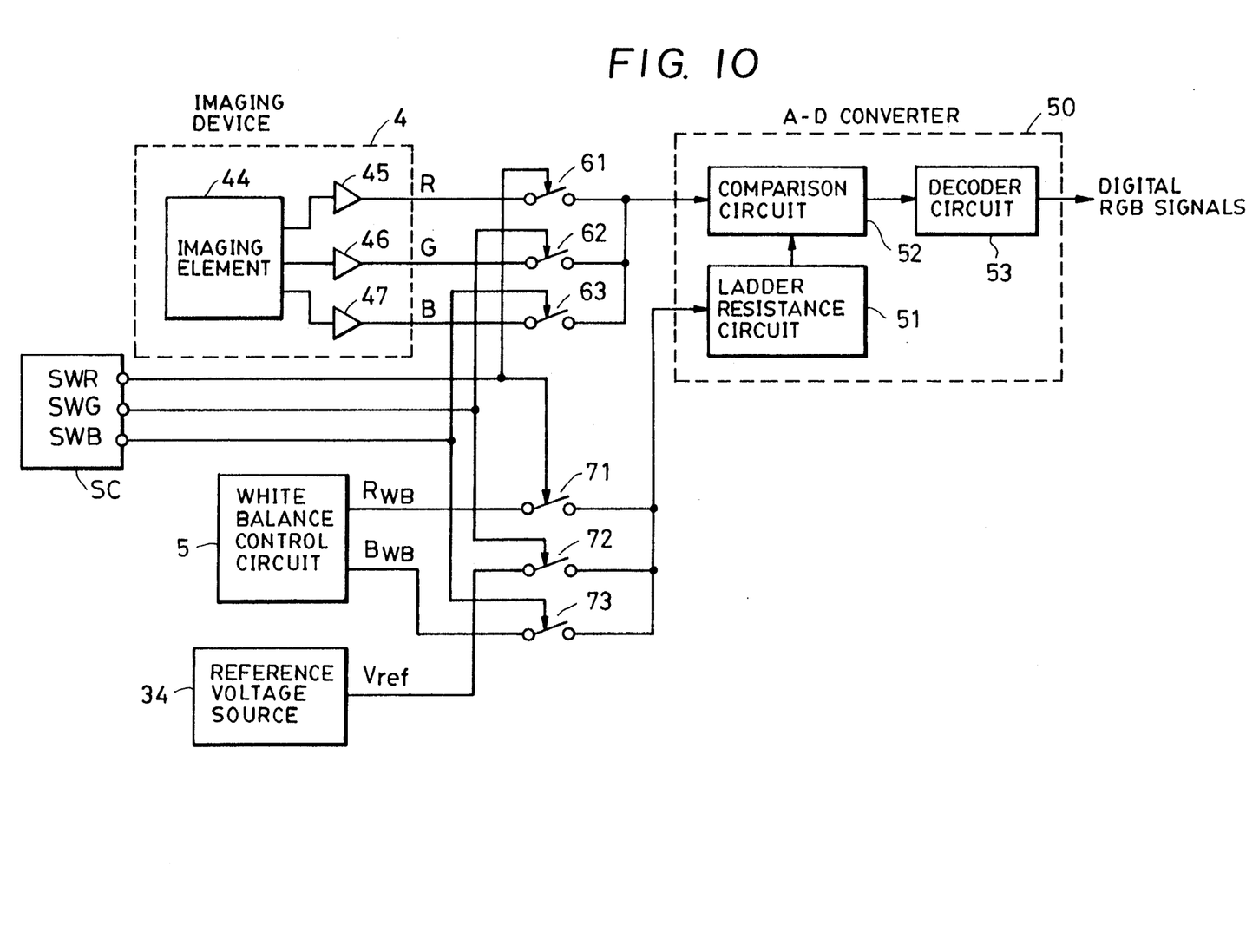
FIG. 10 is a block diagram of a fifth embodiment of the present invention.

FIG. 10 shows a fifth embodiment of the present invention. In FIG. 10, circuit blocks corresponding to those FIGS. 1 through 9 are indicated by like numerals, and explanation thereof will be omitted. In FIG. 10 there are shown an imaging element 44 and R, G and B signal output circuits 45–47. Switches 61, 62 arid 63 switch R, G and B signals which are simultaneously output From the imaging device 4 by switching red, green arid blue signals SWR, SWG arid SWB, respectively. Switches 71, 72 and 73 switch the $R_{WB}$ and $B_{WB}$ which are output from the which balance control circuit 5 and the voltage $V_{ref}$ which is output from the reference voltage source 34 by the switching signals SWR, SWG and SWB, respectively. The switching signals SWR, SWG and SWB from a system controller SC are provided, for example, so that a high-band luminance signal is formed by switching each signal in an identical order as a color-filter arrangement provided for a picture-element arrangement in the horizontal direction of the imaging device 4.

In the present embodiment, each of the R, G and B signals which are output from the imaging device 4 is switched by switches 61, 62 and 63 in accordance with the picture-element arrangement of the imaging element 44, respectively, and subjected to time-division multiplex into a one-channel signal, and then supplied to a comparison circuit 52 of an A-D converter 50. On the other hand, each of like $R_{WB}$ and $B_{WB}$ signals which are output from tile while balance control circuit 5 and the reference voltage $V_{ref}$, which is output from the reference voltage source 34, is switched by the switches 71, 72 and 73 in accordance with the picture-element arrangement of the imaging element 44, respectively, and subjected to time-division multiplex into a one-channel signal, and then supplied to the ladder resistance circuit 51 as a reference voltage. Accordingly, the $R_{WB}$ signal is supplied to a ladder resistance circuit 51 when the R signal is supplied to the comparison circuit 52, the $V_{ref}$ is supplied to the ladder resistance circuit 51 when the G signal is supplied to the comparison circuit 52, and the $B_{WB}$ signal is supplied to the ladder resistance circuit 51 when the B signal is supplied to the comparison circuit 52. Hence, each signal is A/D converted with a proper full scale range.

As explained above, in the present embodiment, an always even quantization accuracy can be obtained over the entire control range of white balance using a one-channel A-D converter, and it is also possible to obtain digital signals in which white balance control has been completed.

Furthermore, in the present invention, the ladder resistance circuit used when each of R, G and B signals is A/D converted is identical, and so it is possible to perform A/D conversion of each of the R, G and B signals with a completely identical quantization accuracy.

Figure 11:
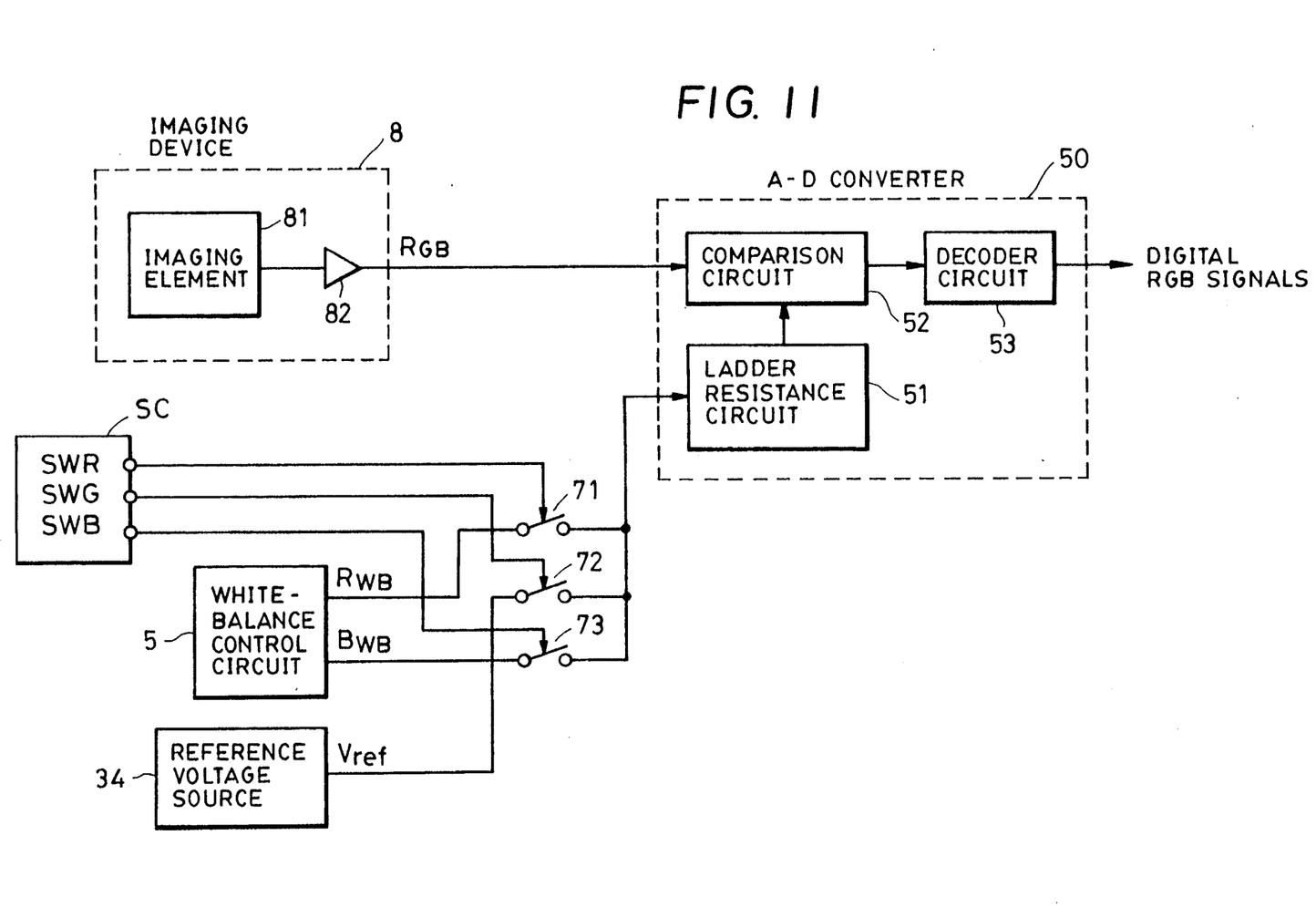
FIG. 11 is a circuit and block diagram of a sixth embodiment of the present invention.

FIG. 11 shows a sixth embodiment of the present invention. In FIG. 11, circuit blocks corresponding to those in the fifth embodiment are indicated by like numerals. In FIG. 11, there are shown an imaging device 8, an imaging element 81 and an output circuit 82. The imaging element 81 outputs R, G and B signals from one output terminal corresponding to time-division multiplex. In the present embodiment, image signals from the imaging device 8 are directly supplied to the comparison circuit 52 of the A-D converter 50. As in the first embodiment, a control vol rage which is switched in accordance with a color-filter arrangement provided for a picture-element arrangement in the horizontal direction of the imaging element 81 is supplied to the ladder circuit 51. As a result, among image signals from the imaging device 8, the $R_{WB}$, $V_{ref}$ and $B_{WB}$ are supplied to the ladder resistance circuit 51 when the R, G and B components are subjected to A/D conversion, respectively, and each component is subjected to A/D conversion with a proper full scale range.

As explained above, by providing means for performing A/D conversion of output signals of an imaging device using a one-channel A-D converter, and switching the full scale range of the A-D converter in accordance with the signal component which is being subjected to A/D conversion, an always even quantization accuracy can be obtained over the entire control range of white balance without remarkably increasing circuit scale and it becomes also possible to obtain digital signals in which white balance control has been completed, and performs A/D conversion of each of the R. G and B signals with a completely identical quantization accuracy.

The elements shown in block Form, i.e., tile gain control circuit GCC, the comparison circuits 2, 12, 22, 32, 42 and 52, the decoder circuits 3, 13, 23, 33, 43, and 53, the comparator C, the imaging devices 4 and 8, the while balance control circuit 5, the added and averaging circuits 6a and 6b and the system controller SC are all individually well known; and no special construction of any of these circuits is critical to the invention of related to the best mode of carrying out the invention.

What is claimed is:

1. An analog to digital converter comprising quantizing means for quantizing an image signal in quantization steps according to the level of the image signal, weighting means for selectively weighting each of the quantization steps, and a digital decoder for producing digital signals corresponding to outputs from the quantizing means, wherein said weighting means if structured and arranged to set a weight for each of the quantization steps in accordance with a gamma characteristic and a white compression characteristic of the image signal.

2. An analog to digital converter according to claim 1, further including a plurality of constant current sources connected to said weighting means for adjusting the weight for quantization steps.

3. An analog to digital converter according to claim 2, wherein said constant current source comprises a resistor.

4. An analog to digital converter according to claim 1, wherein said weighting means comprises a ladder resistance circuit.

5. An analog to digital converter according to claim 1, further including gain control means for controlling gain of said analog to digital converter by changing a bias voltage of said weighting means.

6. An A/D converter comprising:
 (a) quantizing means for quantizing an analog input signal by predetermined quantization steps, and
 (b) quantization step setting means for setting up the quantization steps,
 wherein weighting of the quantization steps is in successively changing order, and
 wherein the quantization steps for which weighting is performed comprise a portion corresponding to gamma characteristics of an input image signal and a portion corresponding to white compression characteristics.

7. An A/D converter according to claim 6, further including a plurality of constant current sources connected to said quantization step setting means.

8. An A/D converter according to claim 7, wherein said constant current source comprises a resistor.

9. An A/D converter according to claim 6, wherein said quantization step setting means comprises a ladder resistance circuit.

10. An A/D converter according to claim 6, further comprising gain control means for controlling a gain of said A/D converter by changing a bias voltage of said quantization step setting means.

11. An image signal processor comprising quantizing means for quantizing an image signal in quantization steps according to the level of the image signal and weighting means for weighting said quantization steps in accordance with a gamma characteristic and a white compression characteristic of the image signal.

12. An image signal processor according to claim 11, wherein said weighting means comprises a constant current source.

13. An image signal processor according to claim 11, wherein said weighting means comprises a ladder resistance circuit.

14. An image signal processor according to claim 11, further comprising control means for changing a bias voltage of said weighting means.

* * * * *

UNITED STATES PATENT AND TRADEMARK OFFICE
CERTIFICATE OF CORRECTION

PATENT NO. : 5,343,201
DATED : August 30, 1994
INVENTOR(S) : TSUTOMU TAKAYAMA, ET AL.

It is certified that error appears in the above-identified patent and that said Letters Patent is hereby corrected as shown below:

ON TITLE PAGE

In [56] References Cited, under U.S. PATENT DOCUMENTS:
"Kuchernan et al." should read --Kucheran et al.--.

COLUMN 3

Line 3, "comparators $C_1$-$C_2$-1." should read
--comparators $C_1$---$C_2^N$-1.--.
Line 18, "a" should be deleted.
Line 44, "comparators $C_1$-$C_2^N$-1." should read
--comparators $C_1$---$C_2^N$-1.--.
Line 49, "circuit 11," should read --circuit 11.--.
Line 51, "ages, which constitute a weighting means," should read --ages--.
Line 52, "$V_3$,...," should read --$V_3$---$V_{2N-K}$,-- and
"111," should read -- --- --.
Line 62, "---$V_2^N$-1" should read -- ---$V_{2-1}$-- and
"$V_2$-2, $V_2^N$-1" should read --$V_{2-2}$, $V_2^N$-1--.

COLUMN 4

Line 1, "214, 15 and I6," should read --14, 15 and 16.--.
Line 9, "terminal s c-d," should read --terminals c-d,--.

COLUMN 5

Line 29, "vol rage $B_{WB}$" should read --voltage $B_{WB}$--.
Line 41, "R." should read --R,--.

UNITED STATES PATENT AND TRADEMARK OFFICE
CERTIFICATE OF CORRECTION

PATENT NO. : 5,343,201
DATED : August 30, 1994
INVENTOR(S) : TSUTOMU TAKAYAMA, ET AL.

Page 2 of 3

It is certified that error appears in the above-identified patent and that said Letters Patent is hereby corrected as shown below:

COLUMN 5

Line 42, "aver-ages tile" should read --averages the--.
   Line 66, "carl" should read --can--.

COLUMN 6

Line 20, "From" should read --from--.
   Line 23, "which balance" should read --white-balance--.
   Line 41, "tile while" should read --the white--.

COLUMN 7

Line 11, "vol rage" should read --voltage--.
   Line 32, "R." should read --R,--.
   Line 36, "Form, i.e., tile" should read --form, i.e., the--.
   Line 40, "while" should read --white-- and "added" should read --adder--.
   Line 43, "of" should read --or--.
   Line 54, "if" should read --is--.

UNITED STATES PATENT AND TRADEMARK OFFICE
CERTIFICATE OF CORRECTION

PATENT NO. : 5,343,201
DATED : August 30, 1994
INVENTOR(S) : TSUTOMU TAKAYAMA, ET AL.

It is certified that error appears in the above-identified patent and that said Letters Patent is hereby corrected as shown below:

<u>COLUMN 8</u>

Line 38, "a" should be deleted.

Signed and Sealed this

Seventeenth Day of January, 1995

Attest:

BRUCE LEHMAN

Attesting Officer     Commissioner of Patents and Trademarks